(12) United States Patent
Webster et al.

(10) Patent No.: US 7,595,839 B2
(45) Date of Patent: *Sep. 29, 2009

(54) IMAGE SENSOR CHIP PACKAGING METHOD

(75) Inventors: Steven Webster, Miao-li (TW); Ying-Cheng Wu, Miao-li (TW); Kun-Hsieh Liu, Miao-li (TW)

(73) Assignee: Altus Technology Inc., Chu-Nan, Miao-li Hsien ( * ) Notice: Subject to any disclaimer, the term of this patent is extended or adjusted under 35 U.S.C. 154(b) by 425 days.

This patent is subject to a terminal disclaimer.

(21) Appl. No.: 11/595,331

(22) Filed: Nov. 10, 2006

(65) Prior Publication Data

US 2007/0126916 A1 Jun. 7, 2007

(51) Int. Cl.
*H04N 5/225* (2006.01)
(52) U.S. Cl. ..................................... 348/374
(58) Field of Classification Search .................. 348/374
See application file for complete search history.

(56) References Cited

U.S. PATENT DOCUMENTS

| 5,122,861 | A  | * | 6/1992 | Tamura et al. | 257/434 |
| 5,998,878 | A  | * | 12/1999 | Johnson | 257/797 |
| 6,649,834 | B1 | * | 11/2003 | Hsieh et al. | 174/527 |
| 6,747,261 | B1 | * | 6/2004 | Hsieh et al. | 250/208.1 |
| 7,045,396 | B2 | * | 5/2006 | Crowley et al. | 438/123 |
| 7,183,589 | B2 | * | 2/2007 | Kameyama et al. | 257/100 |
| 7,408,244 | B2 | * | 8/2008 | Lee et al. | 257/666 |
| 2004/0179243 | A1 | * | 9/2004 | Hsieh et al. | 358/474 |
| 2005/0062083 | A1 | * | 3/2005 | You et al. | 257/291 |
| 2005/0212947 | A1 | * | 9/2005 | Sato et al. | 348/340 |
| 2005/0285016 | A1 | * | 12/2005 | Kong et al. | 250/208.1 |
| 2006/0103953 | A1 | * | 5/2006 | Lee et al. | 359/819 |
| 2007/0040932 | A1 | * | 2/2007 | Chen | 348/374 |

FOREIGN PATENT DOCUMENTS

CN 03100661.2 8/2004

* cited by examiner

*Primary Examiner*—James M Hannett
(74) *Attorney, Agent, or Firm*—Zhigang Ma

(57) ABSTRACT

An image sensor chip packaging method includes: first, providing a carrier (20). The carrier includes a base (21) and a lead frame (23). The base has a chamber (214) defined therein. The lead frame has a plurality of conduction pieces (233). The conduction pieces of the lead frame are embedded in the base and are spaced from each other. An image sensor chip (30) is then mounted in the chamber. The image sensor has a photosensitive area (301) and a plurality of chip pads (302). A plurality of bonding wires (40) is then provided. Each wire electrically connects a corresponding chip pad of the image sensor chip and one of the exposed ends of a corresponding conduction piece of the carrier. A holder (50) having a holding cavity (54) is then provided. Finally, the carrier is then mounted in the holding cavity of the holder.

19 Claims, 5 Drawing Sheets

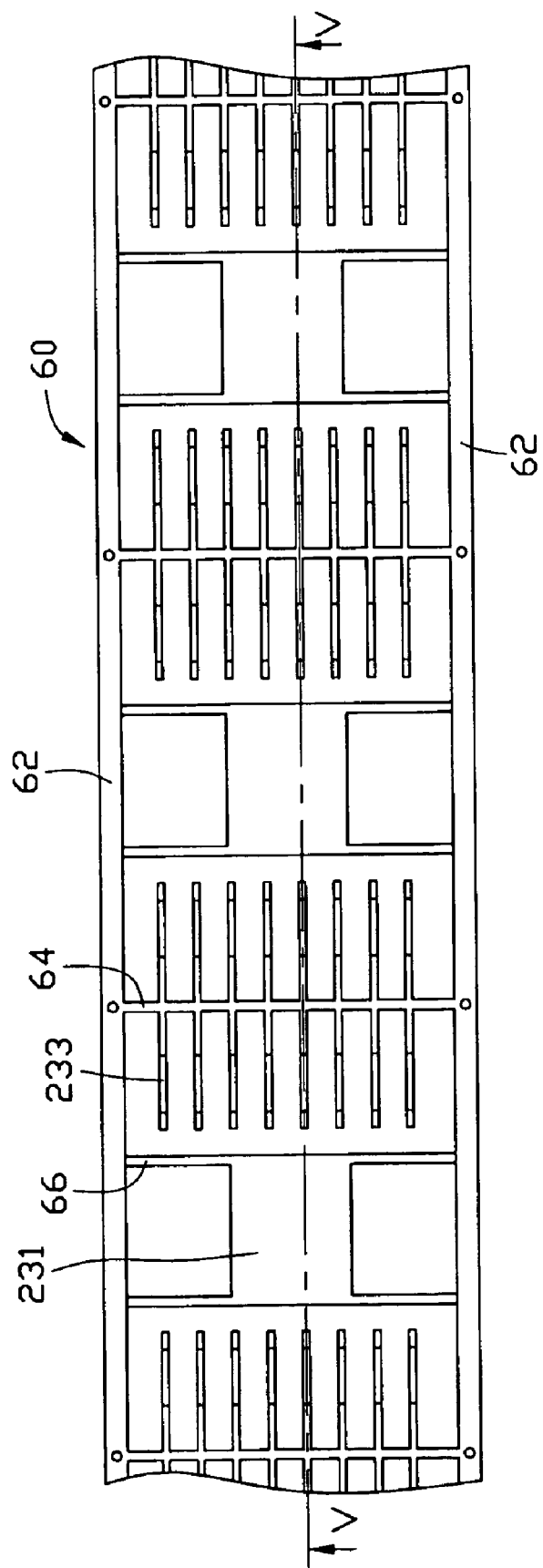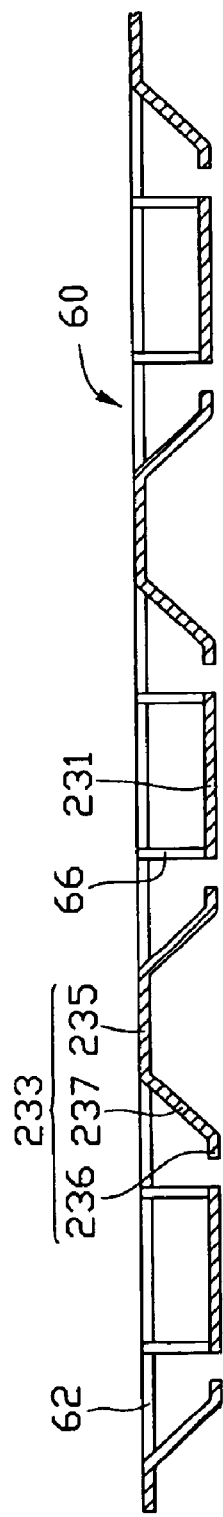

IMAGE SENSOR CHIP PACKAGING METHOD

CROSS-REFERENCE TO RELATED APPLICATION

This application is related to a co-pending U.S. patent application Ser. No. 11/595,297, entitled "DIGITAL CAMERA MODULE PACKAGING METHOD", by Steven Webster et al. Such application has the same assignee as the present application and is concurrently filed herewith. The disclosure of the above-identified application is incorporated herein by reference.

TECHNICAL FIELD

The present invention generally relates to an integrated circuit (IC) chip packaging method and, more particularly, to a packaging method for an image sensor chip which is configured (i.e. structured and arranged) for use in an image capturing module such as a digital camera module.

BACKGROUND

Image sensors are widely used in image capturing modules such as digital camera modules in order to convert optical image signals of an object into electronic signals. In order to protect the image sensor from contamination or pollution (i.e. from dust or water vapor), the image sensor is generally sealed in a structural package.

An image sensor chip package made according to a typical packaging method is illustrated in FIG. 1. The packaging method includes the following steps: firstly, a plurality of bracket-shaped conductors 10 are provided. Secondly, molten plastic is injected to partially enclose the conductors 10, thereby forming a base 11, with some surfaces of the conductors 10 being exposed outside of the base 11. Thirdly, a ring-like middle portion 12 is formed on the base 11 by means of injection molding. The base 11 and the middle portion 12 cooperatively form a space 13. Fourthly, an image sensor 15 having a plurality of pads 14 is disposed on the base 11 in the space 13. Fifthly, a plurality of bonding wires 16 are provided to connect the pads 14 and the conductors 10. Finally, a cover 17 is secured to the top of the middle portion 12 with an adhesive, thereby hermetically sealing the space 13 and allowing light beams to pass therethrough.

In the process of bonding the wires 16, each wire 16 needs to be connected with one conductor 10. As a result, the space 13 needs to be relatively large, for allowing movement of a wire bonding tool therein. This method of bonding wires 16 is complex and expensive. In addition, the relatively large volume of the image sensor chip package allows more dust particles to adhere to the cover 17, the middle portion 12, and the base 11. Thus, more dust particles are liable to drop onto the image sensor 15. The dust particles may obscure part of the optical path to the image sensor 15, and produce errors in the image sensing process. As a result, the quality and/or reliability of the image sensor chip package may be impaired.

Therefore, a new image sensor chip packaging method is desired in order to overcome the above-described shortcomings.

SUMMARY OF THE INVENTION

One embodiment of an image sensor chip packaging method includes:

1) Providing a carrier comprising a base and a lead frame, the base having a chamber defined therein, the lead frame including a plurality of conduction pieces, the conduction pieces of the lead frame being embedded in the base and being spaced from each other, one end of each conduction piece being exposed at one surface of the base, and another end of the conduction piece being exposed at another surface of the base.

2) Mounting an image sensor chip in the chamber, the image sensor chip having a photosensitive area and a plurality of chip pads.

3) Providing a plurality of wires, and electrically connecting each wire with a corresponding chip pad of the image sensor chip and one of the exposed ends of a corresponding conduction piece of the carrier.

4) Providing a holder, the holder having a holding cavity.

5) Mounting the carrier into the holding cavity of the holder.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating aspects of the image sensor chip package made according to the principles of the image sensor chip packaging method. Moreover, in the drawings, like reference numerals designate corresponding parts throughout the several views.

FIG. 4 is a top plan view of a plurality of lead frames joined together during one stage in the digital camera module packaging method of the preferred embodiment, the lead frames being for use in a plurality of carrier preforms that are used in making a plurality of image sensor chip packages of FIG. 1.

FIG. 5 is a cross-sectional view taken along line V-V of FIG. 4.

DETAILED DESCRIPTION OF THE PREFERRED EMBODIMENTS

Figure 1:
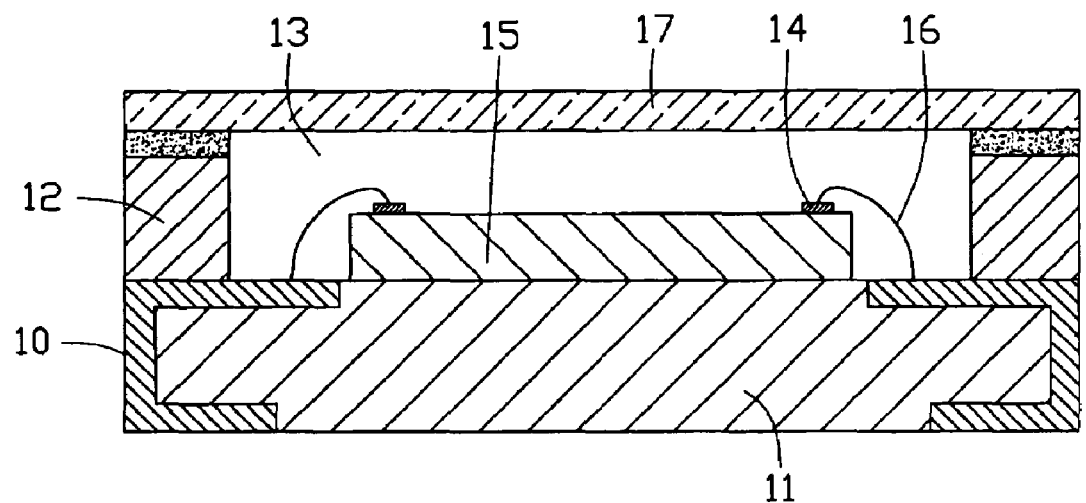
FIG. 1 is a cross-sectional view of a conventional image sensor chip package.
Figure 2:
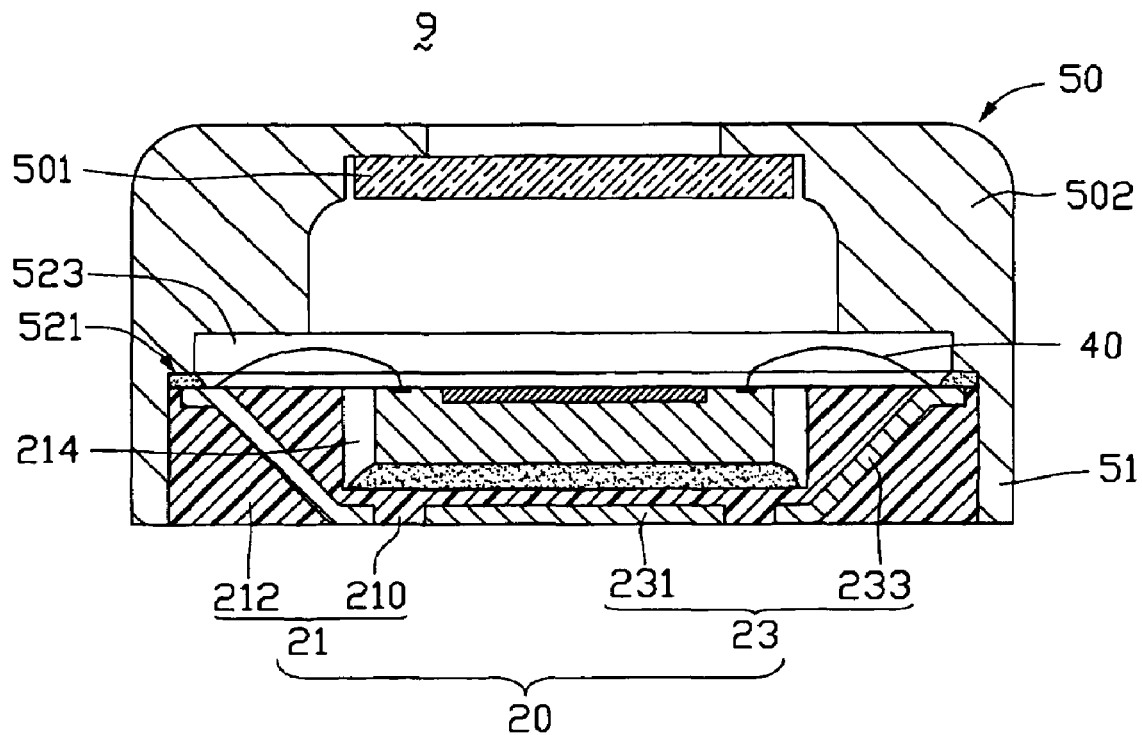
FIG. 2 is a first cross-sectional view of an image sensor chip package made according to an image sensor chip packaging method of a preferred embodiment of the present invention, the image sensor chip package including a holder and a carrier.
Figure 3:
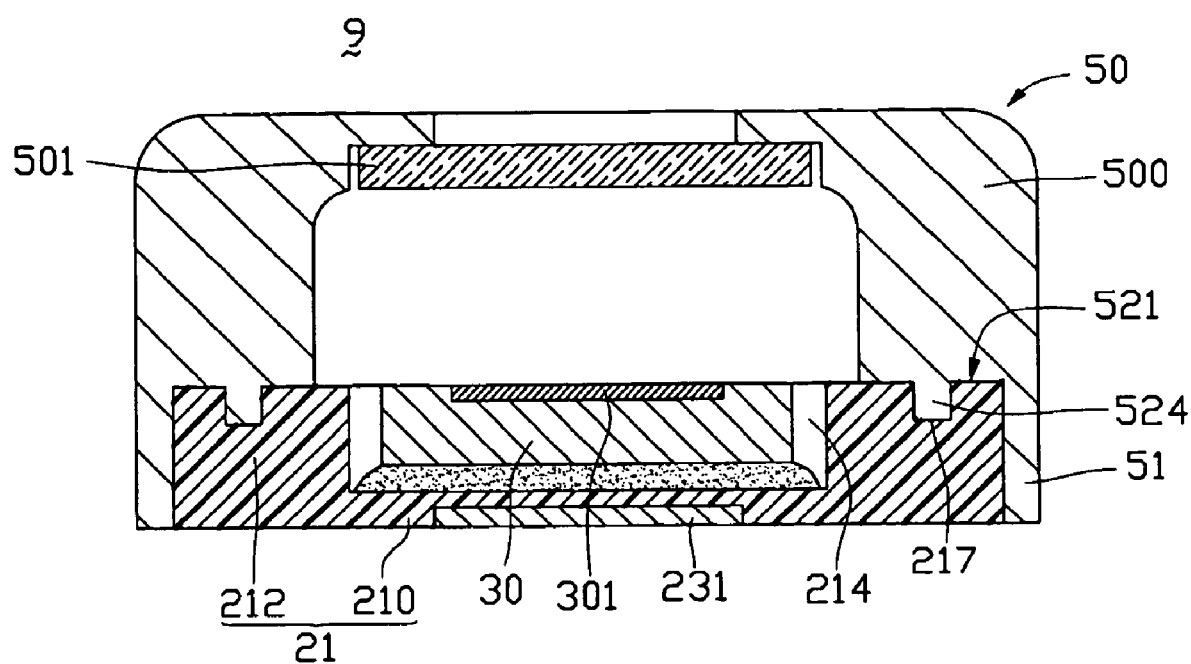
FIG. 3 is similar to FIG. 2, but is a second cross-sectional view, with a plane of the second cross-section being perpendicular to a plane of the first cross-section.

Referring to FIGS. 2-3, an image sensor chip package 9 made according to an image sensor chip packaging method of a preferred embodiment of the present method is shown. The image sensor chip package 9 is configured for use in an image capturing module such as a digital camera module. The image sensor chip package 9 includes a carrier 20, an image sensor chip 30, a plurality of bonding wires 40, and a holder 50. The chip 30 is received in the carrier 20. The wires 40 electronically connect the carrier 20 and the chip 30. The carrier 20 is received in a bottom cavity of the holder 50.

Figure 6:
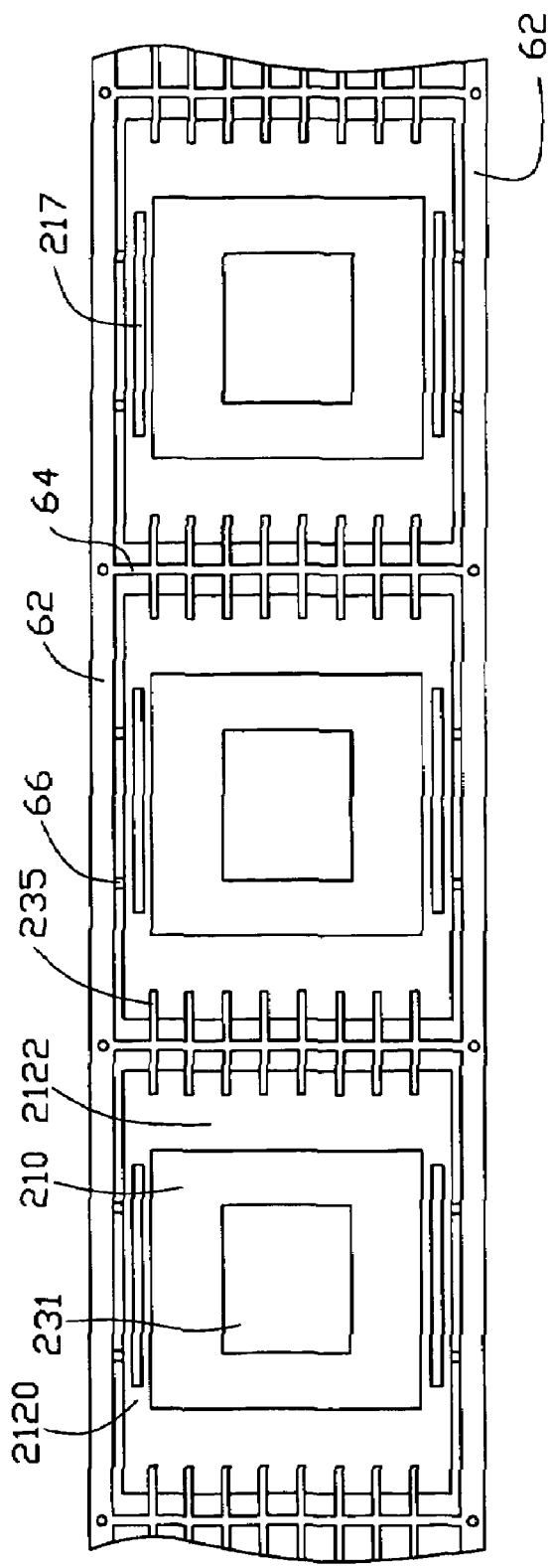
FIG. 6 is a top plan view of a plurality of carrier preforms joined together during a subsequent stage in the digital camera module packaging method of the preferred embodiment, the carrier preforms being for use in a plurality of carriers that are used in making the plurality of image sensor chip packages of FIG. 1.

Also referring to FIG. 6, the carrier 20 includes a base 21 and a lead frame 23. The base 21 is essentially made from a plastic material such as, polyphenylene oxide (PPO), polyphenylene sulfide (PPS), or the like. The base 21 is rectangular in shape as viewed from above, and has a generally U-shaped side cross section. In alternative embodiments, the base 21 may have any of various shapes, including square, circular, and the like. A chamber 214 is defined in the base 21. The chamber 214 is configured for receiving the chip 30. The base 21 includes a main board 210 and a sidewall 212. The sidewall 212 perpendicularly extends upward from an outer periphery of the main board 210, and includes two parallel first walls 2120 and two parallel second walls 2122. A slot 217 is defined in a top end of each first wall 2120, the slot 217 being parallel to the first wall 2120 itself.

The lead frame 23 is preferably made of conductive metal material with good electrical and thermal conductivity, such as copper or iron-nickel alloy, in order to enhance the signal transmission and thermal transmission characteristics of the image sensor chip package 9. The lead frame 23 is embedded in the base 21, and includes a thermal conduction piece 231 and a plurality of electrical conduction pieces 233. The thermal conduction piece 231 is substantially rectangular in shape.

Referring also to FIGS. 4-7, each electrical conduction piece 233 includes a top portion 235, a middle portion 237, and a bottom portion 236. The top and bottom portions 235, 236 are spaced apart and aligned in parallel to each other. The middle portion 237 is slanted relative to the top and bottom portions 235, 236 and interconnects the top and bottom portions 235, 236. The electrical conduction pieces 233 are divided into two groups. The two groups are symmetrically arranged at opposite sides of the carrier 20 at the second walls 2122 respectively, and electrical conduction pieces 233 of the same group are aligned parallel to and spaced from each other. The thermal conduction piece 231 is located between the two groups of electrical conduction pieces 233. The thermal conduction piece 231 and the bottom portions 236 are aligned in the same horizontal plane. The top and bottom portions 235, 236 are both configured for electrically connecting with other electrical components. For example, the top portions 235 can be used to electrically connect to the chip 30, and the bottom portions 236 can be used to electrically connect with a printed circuit board (PCB), whereby signals can be transmitted from the chip 30 to the PCB.

The chip 30 is received in the chamber 214 of the carrier 20, and is fixed to the main board 210 of the carrier 20 with an adhesive. The adhesive may be chosen from the group including silicone adhesive, epoxy, acrylic adhesive, and polyamide adhesive. A top surface portion of the chip 30 includes a central photosensitive area 301, and a plurality of chip pads 302 arranged at two opposite sides of the photosensitive area 301. That is, the chip pads 302 are divided into two groups that are symmetrically opposite each other across the photosensitive area 301. Each group is adjacent to one corresponding second wall 2122 of the base 21. The chip pads 302 in each group are aligned parallel to each other, and spaced from each other at regular intervals.

The wires 40 can be made of an electrically conductive material such as, for example, gold or aluminum alloy. One end of each wire 40 is connected/joined with a respective chip pad 302 of the chip 30, and the other end of the wire 40 is connected/joined with one top portion 235 of the lead frame 23.

Figure 8:
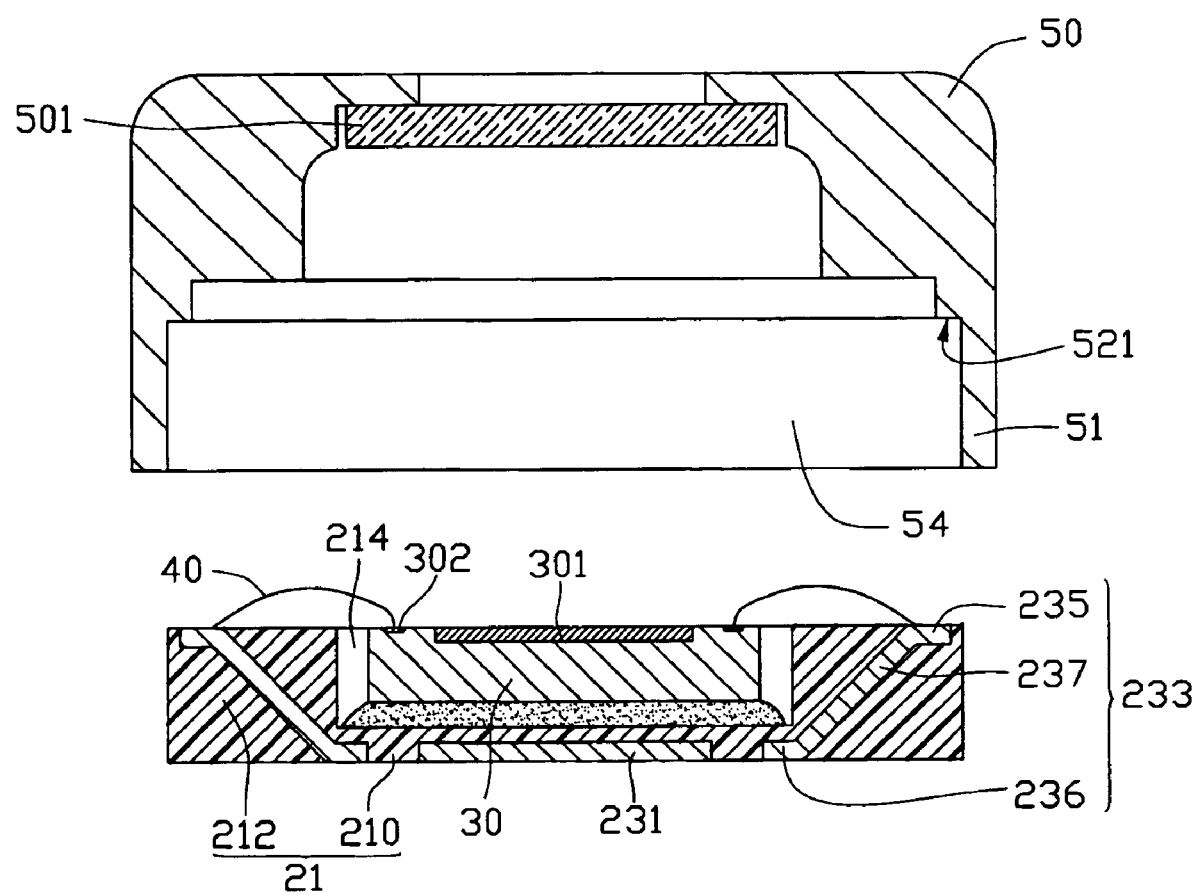
FIG. 8 is similar to FIG. 7, but showing the carrier preform assembly after it has been heated/irradiated in a still further stage in the image sensor chip packaging method of the preferred embodiment, and showing the holder of FIG. 2 ready to be attached onto the carrier.

Referring to FIGS. 2-3 and 8, the holder 50 is substantially rectangular in shape, and includes two parallel first sidewalls 500 and two parallel second sidewalls 502. In alternative embodiments, the holder 50 may have any of various shapes, such as square, circular, or any other appropriate shape corresponding to the shape of the base 21. The sidewalls 500, 502 have a common peripheral surface 521. The holder 50 has a half-closed end and an open end. The half-closed end has a transparent board 501 mounted in a middle portion thereof. Thus the transparent board 501 can overlie the chip 30, so that the chip 30 receives image light transmitted through the transparent board 501. A peripheral projection 51 extends from an outer periphery of the surface 521 of the sidewalls 500, 502, thereby defining a holding cavity 54 therebetween. A protrusion 524 extends perpendicularly down from a central portion of each first sidewall 500, the protrusion 524 being parallel to the first sidewall 500 itself. An inner periphery of each of the second sidewalls 502 is recessed, thereby defining a receiving cavity 523 cooperatively bounded by the second sidewalls 502 and the first sidewalls 500. The receiving cavity 523 is configured for receiving the wires 40 therein. A size of the carrier 20 is substantially equal to a size of the holding cavity 54, and is larger than a size of the receiving cavity 523. The holder 50 is fixed to the base 21 by adhesive, and thereby hermetically seals the chip 30 held in the chamber 214 of the base 21 from the external environment.

An exemplary method of fabricating the image sensor chip package 9 is as follows. In one embodiment, a plurality of image sensor chip packages 9 are fabricated simultaneously to minimize the cost associated with each individual image sensor chip package 9. Referring to FIGS. 4 and 5, firstly, a conductor element 60 is provided. The conductor element 60 is formed from a metal sheet or plate by punching or/and etching. The conductor element 60 includes two opposite narrow strips 62, a plurality of supporting beams 64, and a plurality of lead frames 23. The two narrow strips 62 are parallel to each other. Each of the supporting beams 64 perpendicularly interconnects the two narrow strips 62. The supporting beams 64 are parallel to each other and are evenly spaced from each other.

The lead frames 23 are punched so that each of the lead frames 23 has the thermal conduction piece 231 and the electrical conduction pieces 233. Each thermal conduction piece 231 is connected to the two narrow strips 62 by four connecting arms 66. Each electrical conduction piece 233 is perpendicularly connected to one supporting beam 64.

Secondly, molten plastic is injected around the conductor element 60 by insert molding. The plastic is solidified, thereby forming a plurality of the base preforms. An upper surface of each top portion 235 is exposed, thus forming a plurality of upper pads. A bottom surface of each bottom portion 236 is exposed, thus forming a plurality of lower pads.

The base preforms and the lead frames 23 cooperatively form a plurality of carrier preforms connected to each other, as represented in FIG. 6.

Figure 7:
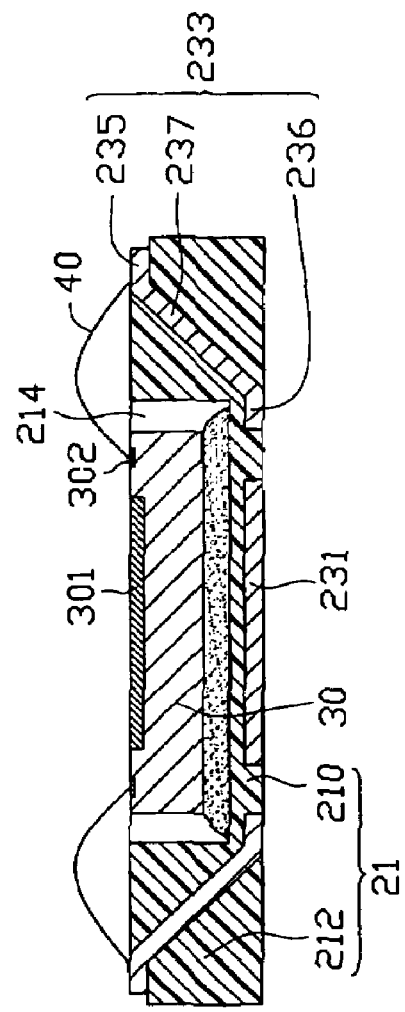
FIG. 7 is an enlarged, side cross-sectional view of one of the carrier preforms of FIG. 6, after it has had an image sensor chip and a plurality of bonding wires attached thereon, and after this carrier preform assembly has been cut from adjacent carrier preform assemblies in a further stage in the image sensor chip packaging method of the preferred embodiment.

Thirdly, referring to FIG. 7, each chip 30 is mounted in one corresponding chamber 214, and is fixed to the main board 210 of the carrier preform via adhesive. Alternatively, any other appropriate fixing means can be employed, such as metallurgical fixing means.

Fourthly, one end of each wire 40 is connected/joined with one respective chip pad 302 of the chip 30, and the other end of the wire 40 is connected/joined with the upper pad of one respective top portion 235 of the lead frame 23.

Fifthly, the conductor element 60 with the base preforms is cut where adjacent carrier preforms adjoin each other and where the connecting arms 66 connect with the thermal conduction pieces 231, so as to separate the connected carrier preforms from each other and from the narrow strips 62. At that time, in each carrier preform, distalmost ends of the top portions 235 of the lead frames 23 are exposed at outsides of the respective sidewalls 212 of the base preform. Usually, each top portion 235 is shortened slightly owing to a shrinkage characteristic thereof when the carrier preform is cut.

Sixthly, fusing technology such as ultrasonic fusing, laser fusing or heat fusing is used to heat/irradiate a periphery of each carrier preform, thus melting the base preform so that the distalmost ends of the top portions 235 of the lead frames 23 are enclosed by the sidewalls 212, as represented in FIG. 8. Thereby, each base preform is made into a base 21, and a plurality of finished carriers 20 is obtained.

Finally, each holder 50 is laid over the corresponding chip 30, which receives light transmitted through the holder 50. The holder 50 is fixed on the base 21 by adhesive, and thereby hermetically seals the chip 30 held in the chamber 214 of the base 21 from the external environment. The surface 521 at the second sidewalls 502 is fixed to the second walls 2122 of the base 21 with adhesive. Portions of the upper pads of the carrier 20 adjacent the adhesive remain exposed. The wires 40 are received in the receiving cavity 523. The protrusions 524 of the first sidewalls 500 are engagingly received in the slots 217 of the first walls 2120. Thus the carrier 20 is received in the holding cavity 54 of the holder 50, as shown in FIGS. 2-3. The process of manufacturing a plurality of the image sensor chip packages 9 is thus completed.

Forming a plurality of image sensor chip packages 9 simultaneously in this manner has several advantages. One advantage is that it is less labor intensive to handle and process a plurality of image sensor chip packages 9 simultaneously rather than handling and processing each image sensor chip package 9 individually. By reducing labor, the cost associated with each image sensor chip package 9 is minimized.

The base 21 of the carrier 20 is made of plastic material, which is generally much cheaper than ceramic. The carrier 20 is formed using injection molding technology, which is a relatively simple method of manufacturing. Thus, the cost of the image sensor chip packages 9 is reduced.

The lead frame 23 of the carrier 20 is a solid single piece, and is substantially encapsulated by the base 21. Therefore it is difficult for water vapor to penetrate into the image sensor chip package 9 through the base 21. The chip 30 is protected from pollution or contamination, and the reliability of the image sensor chip package 9 is enhanced.

The upper surfaces of the top portions 235 of the lead frame 23 act as the upper pads. Accordingly, ample space is available above the upper pads for the use of a wire bonding tool to bond the wires 40 to the upper pads. Thus, the size of the carrier 20 can be minimized to approach the size of the chip 30, and the volume of the image sensor chip package 9 can be minimized correspondingly.

In addition, as the image sensor chip package 9 has a relatively small volume, it contains relatively few dust or other foreign particles therein. Therefore any pollution and/or contamination of the photosensitive area 301 is reduced, and the quality and reliability of the image sensor chip package 9 can be much improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An image sensor chip packaging method, comprising:
providing a carrier comprising a base and a lead frame, the base having a chamber defined therein, the lead frame having a plurality of electrical conduction pieces, the electrical conduction pieces of the lead frame being embedded in the base and being spaced from each other, one end of each electrical conduction piece being exposed at one surface of the base, and another end of the electrical conduction piece being exposed at another surface of the base;
mounting an image sensor chip in the chamber, the image sensor chip having a photosensitive area and a plurality of chip pads;
providing a plurality of wires, and electrically connecting each wire with a corresponding chip pad of the image sensor chip and one of the exposed ends of a corresponding electrical conduction piece of the carrier;
providing a holder; and
mounting the carrier to the holder.

2. The method as claimed in claim 1, wherein the lead frame is manufactured by punching or etching a metal sheet, and the base is made of plastic material.

3. The method as claimed in claim 1, wherein each of the electrical conduction pieces of the lead frame comprises a top portion, a middle portion, and a bottom portion, the top and bottom portions are aligned parallel to each other, and the middle portion is slanted at an angle relative to the top and bottom portions.

4. The method as claimed in claim 1, wherein the lead frame further comprises a thermal conduction piece embedded in a central portion of the base.

5. The method as claimed in claim 4, wherein the thermal conduction piece is exposed at one surface of the base.

6. The method as claimed in claim 1, wherein the base further comprises a sidewall, the sidewall defines a slot therein, the holder comprises a plurality of sidewalls, a protrusion extends from one sidewall of the holder, and the protrusion is configured for being engagingly received in the slot.

7. The method as claimed in claim 6, wherein the holder defines a holding cavity, and the carrier is mounted in the holding cavity of the holder.

8. The method as claimed in claim 7, wherein two projections extend from another two opposite sidewalls of the holder thereby defining the holding cavity for receiving the carrier therein.

9. A method for fabricating a plurality of image sensor packages, comprising:

providing a conductor element comprising a plurality of lead frame portions, each lead frame portion comprising a plurality of electrical conduction pieces;

injection molding plastic to partially enclose the conductor element and thereby forming a plurality of carriers connected to each other, each carrier having a plurality of pads formed by portions of the electrical conduction pieces that are exposed at an outside of the carrier and a base preform, one end of each electrical conduction piece being exposed at one surface of the base preform, and another end of the electrical conduction piece being exposed at another surface of the base preform;

mounting a plurality of image sensor chips in the carriers respectively, each image sensor chip having a photosensitive area and a plurality of chip pads;

providing a plurality of wires, and for each carrier, electrically connecting each wire with a corresponding chip pad of the image sensor chip and the pad of a corresponding electrical conduction piece of the carrier;

separating the carriers to form a plurality of individual carriers;

providing a plurality of holders; and mounting the holders onto the carriers respectively.

10. The method as claimed in claim 9, wherein the conductor element is manufactured by punching or etching a metal sheet.

11. The method as claimed in claim 9, wherein each of the electrical conduction pieces of each of the lead frame portions comprises an top portion, a middle portion, and a bottom portion, the top and bottom portions are parallel to each other, and the middle portion is slanted relative to the top and bottom portions.

12. The method as claimed in claim 9, wherein the conductor element further comprises two opposite, parallel strips.

13. The method as claimed in claim 12, wherein the conductor element further comprises a plurality of supporting beams, each supporting beam perpendicularly interconnects the two strips, and the electrical conduction pieces of the lead frame portions are connected to the supporting beams.

14. The method as claimed in claim 9, wherein each of the lead frame portions further comprises a thermal conduction piece.

15. The method as claimed in claim 14, wherein the thermal conduction piece of each of the carriers is exposed at an outside of the carrier.

16. The method as claimed in claim 9, wherein each of the carriers comprises a sidewall, the sidewall defines a slot therein, the holder comprises a plurality of sidewalls, a protrusion extends from one sidewall of the corresponding holder, and the protrusion is configured for being engagingly received in the slot.

17. The method as claimed in claim 16, wherein two projections extend from another two opposite sidewalls of the holder thereby defining a holding cavity for receiving the carrier therein.

18. The method as claimed in claim 9, further comprising fusing a periphery of each of the carriers so as to enclose distalmost ends of the pads of the electrical conduction pieces in the carrier.

19. The method as claimed in claim 1, wherein one end of each electrical conduction piece being substantially coplanar with one surface of the base, and another end of the electrical conduction piece being substantially coplanar with another surface of the base.

* * * * *